US012618913B2

(12) United States Patent
Jung et al.

(10) Patent No.: US 12,618,913 B2
(45) Date of Patent: May 5, 2026

(54) METHOD AND DEVICE WITH BATTERY MODEL OPTIMIZATION

(71) Applicant: Samsung Electronics Co., Ltd., Suwon-si (KR)

(72) Inventors: Daebong Jung, Hwaseong-si (KR); Young Hun Sung, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 136 days.

(21) Appl. No.: 17/689,359

(22) Filed: Mar. 8, 2022

(65) Prior Publication Data
US 2023/0100216 A1 Mar. 30, 2023

(30) Foreign Application Priority Data
Sep. 29, 2021 (KR) ......................... 10-2021-0129038

(51) Int. Cl.
*G01R 31/387* (2019.01)
*H01M 10/42* (2006.01)
*H01M 10/44* (2006.01)

(52) U.S. Cl.
CPC ...... *G01R 31/387* (2019.01); *H01M 10/4285* (2013.01); *H01M 10/443* (2013.01)

(58) Field of Classification Search
CPC ................ G01R 31/387; G01R 31/367; G01R 31/3648; G01R 31/382; H01M 10/4285; H01M 10/443; H01M 10/48; Y02E 60/10
See application file for complete search history.

(56) References Cited

U.S. PATENT DOCUMENTS 6,262,577 B1 7/2001 Nakao et al.
8,332,342 B1 * 12/2012 Saha .................... G01R 31/392
706/45

(Continued)

FOREIGN PATENT DOCUMENTS

CN 103399281 A * 11/2013
CN 104267261 A 1/2015

(Continued)

OTHER PUBLICATIONS

Extended European search report issued on Oct. 14, 2022, in counterpart European Patent Application No. 22173488.2 (8 pages in English).

(Continued)

*Primary Examiner* — Paresh Patel
*Assistant Examiner* — Dilara Sultana
(74) *Attorney, Agent, or Firm* — Sughrue Mion, PLLC

(57) ABSTRACT

A device with battery model optimization includes: a processor configured to perform optimization on a battery model for determining optimized parameter values of parameters of the battery model, wherein, to perform the optimization, the processor is configured to: select target parameters from among parameters of a battery model; set a current boundary condition for each of the target parameters; determine an optimized parameter value of each of the target parameters based on the set current boundary condition; set a subsequent boundary condition reduced from the current boundary condition based on the determined optimized parameter value; and determine a subsequent optimized parameter value of each of the target parameters based on the subsequent boundary condition.

14 Claims, 9 Drawing Sheets

(56) References Cited

U.S. PATENT DOCUMENTS

| | | | | |
|---|---|---|---|---|
| 2010/0085057 A1* | 4/2010 | Nishi | .................... | H01M 10/44 |
| | | | | 324/427 |
| 2013/0226648 A1 | 8/2013 | Horch et al. | | |
| 2014/0032141 A1* | 1/2014 | Subbotin | ............. | G01R 31/367 |
| | | | | 702/63 |
| 2015/0278704 A1 | 10/2015 | Kim et al. | | |
| 2015/0355283 A1 | 12/2015 | Lee | | |
| 2016/0018469 A1* | 1/2016 | Ho | ........................ | G01R 31/367 |
| | | | | 702/63 |
| 2018/0143254 A1* | 5/2018 | Kim | ..................... | G01R 31/367 |
| 2019/0187212 A1* | 6/2019 | Garcia | ..................... | G06N 3/09 |
| 2020/0018797 A1* | 1/2020 | Gelso | ...................... | B60L 58/12 |
| 2021/0190866 A1* | 6/2021 | You | .................... | G01R 31/3648 |

FOREIGN PATENT DOCUMENTS

| | | |
|---|---|---|
| CN | 104267355 A | 1/2015 |
| CN | 107066722 A | 8/2017 |
| CN | 110165314 A | 8/2019 |
| CN | 111680848 A * | 9/2020 |
| CN | 112765772 A * | 5/2021 | .......... G01R 31/367 |
| JP | 2008-58278 A | 3/2008 |
| JP | 2013-44598 A | 3/2013 |
| JP | 2015-135286 A | 7/2015 |
| JP | 2019-211248 A | 12/2019 |
| JP | 6668945 B2 | 3/2020 |
| KR | 10-0652977 B1 | 11/2006 |
| KR | 10-1593681 B1 | 2/2016 |
| KR | 10-2021-0081059 A | 7/2021 |

OTHER PUBLICATIONS

Korean Office Action Issued on Feb. 19, 2025, in Counterpart Korean Patent Application No. 10-2021-0129038 (6 Pages in English, 9 Pages in Korean).

Notice of Allowance dated Sep. 22, 2025, issued by Chinese Patent Office in Chinese Patent Application 202210423383.8.

Chinese Office Action Issued on Jun. 12, 2025, in Counterpart Chinese Patent Application No. 202210423383.8 (10 Pages in English, 6 Pages in Chinese).

* cited by examiner

METHOD AND DEVICE WITH BATTERY MODEL OPTIMIZATION

CROSS-REFERENCE TO RELATED APPLICATIONS

This application claims the benefit under 35 USC § 119(a) of Korean Patent Application No. 10-2021-0129038, filed on Sep. 29, 2021 in the Korean Intellectual Property Office, the entire disclosure of which is incorporated herein by reference for all purposes.

BACKGROUND

1. Field

The following description relates to a method and device with battery model optimization.

2. Description of Related Art

For optimal management of a battery, a state of the battery may be estimated using various methods. For example, a state of a battery may be estimated by integrating currents of the battery or by using a battery model (e.g., an electric circuit model or an electrochemical model). The current integration method may calculate a remaining amount of the battery by attaching a current sensor to an end of a battery cell, module, or pack and calculating a sum of charge amounts to be charged or discharged. The electric circuit model may be a circuit model including a resistor and a capacitor that represent a voltage value changing as a battery is charged or discharged, and the electrochemical model may be a model that models internal physical phenomena of the battery, for example, a battery ion concentration, a potential, and the like.

SUMMARY

This Summary is provided to introduce a selection of concepts in a simplified form that is further described below in the Detailed Description. This Summary is not intended to identify key features or essential features of the claimed subject matter, nor is it intended to be used as an aid in determining the scope of the claimed subject matter.

In one general aspect, a device with battery model optimization includes: a processor configured to perform optimization on a battery model for determining optimized parameter values of parameters of the battery model, wherein, to perform the optimization, the processor is configured to: select target parameters from among parameters of a battery model; set a current boundary condition for each of the target parameters; determine an optimized parameter value of each of the target parameters based on the set current boundary condition; set a subsequent boundary condition reduced from the current boundary condition based on the determined optimized parameter value; and determine a subsequent optimized parameter value of each of the target parameters based on the subsequent boundary condition.

The processor may be configured to perform the optimization for each of predefined different state of charge (SOC) intervals corresponding to degrees of progress in charging the battery.

The processor may be configured to perform the optimization based on predefined different SOC intervals corresponding to degrees of progress in discharging the battery.

For the setting of the subsequent boundary condition, the processor may be configured to: determine a target change direction of a diffusion parameter based on a voltage error between a voltage of the battery that is estimated through the battery model and a voltage of the battery that is based on profile data of the battery; and set the subsequent boundary condition based on the determined target change direction.

The processor may be configured to perform the optimization for each of predefined temperature intervals.

The processor may be configured to select the target parameters based on a value obtained by performing differentiation one or more times on the parameters of the battery model.

The processor may be configured to, until the number of performances of the optimization reaches a set number, iteratively perform the setting of the subsequent boundary condition reduced from the current boundary condition and the determining of the subsequent optimized parameter value of each of the target parameters based on the subsequent boundary condition.

For the setting of the subsequent boundary condition, the processor may be configured to change the current boundary condition for all the target parameters based on the optimized parameter value retrieved based on the current boundary condition, and the changed boundary condition may correspond to the subsequent boundary condition.

The processor may be configured to: select points associated with a diffusion characteristic of the battery from among the parameters of the battery model; and for the selecting of the target parameters, determine the target parameters based on the selected points.

The processor may be configured to: determine an estimated state value of the battery model based on the target parameters; determine an optimization loss based on a difference between the estimated state value and an actual state value obtained from profile data of the battery; and adjust at least one of the target parameters such that the optimization loss is reduced.

The parameters of the battery model may include a diffusion parameter dependent on an SOC level of the battery, and the diffusion parameter may include a charge parameter associated with charging of the battery and a discharge parameter associated with discharging of the battery.

The electronic device may include a memory storing instructions that, when executed by the processor, configure the processor to perform the optimization.

In another general aspect, a method with battery model optimization includes: selecting target parameters from among parameters of a battery model; and performing optimization on the target parameters, wherein the performing of the optimization may include: setting a current boundary condition for each of the target parameters; determining an optimized parameter value of each of the target parameters based on the set current boundary condition; setting a subsequent boundary condition reduced from the current boundary condition based on the determined optimized parameter value; and determining a subsequent optimized parameter value of each of the target parameters based on the subsequent boundary condition.

The performing of the optimization may include performing the optimization for each of predefined different state of charge (SOC) intervals corresponding to degrees of progress in charging the battery.

The performing of the optimization may include performing the optimization for each of predefined different SOC intervals corresponding to degrees of progress in discharging the battery.

The setting of the subsequent boundary condition may include: determining a target change direction of a diffusion parameter based on a voltage error between a voltage of the battery that is estimated through the battery model and a voltage of the battery that is based on profile data of the battery; and setting the subsequent boundary condition based on the determined target change direction.

The performing of the optimization may include performing the optimization for each of predefined temperature intervals.

In another general aspect, one or more embodiments include a non-transitory computer-readable storage medium storing instructions that, when executed by a processor, configure the processor to perform any one, any combination, or all operations and methods described herein.

In another general aspect, a battery power supplier includes: a battery configured to supply power to an electronic device; and a battery model optimizing device configured to optimize a battery model corresponding to the battery, wherein, for the optimizing of the battery model, the battery model optimizing device may be configured to: select target parameters from among parameters of the battery model; set a current boundary condition for each of the target parameters; determine an optimized parameter value of each of the target parameters based on the set current boundary condition; set a subsequent boundary condition reduced from the current boundary condition based on the determined optimized parameter value; and determine a subsequent optimized parameter value of each of the target parameters based on the subsequent boundary condition.

The battery model optimizing device may be configured to perform the optimizing for each of predefined different state of charge (SOC) intervals corresponding to degrees of progress in charging or discharging the battery.

For the setting of the subsequent boundary condition, the battery model optimizing device may be configured to: determine a target change direction of a diffusion parameter based on a voltage error between a voltage of the battery that is estimated through the battery model and a voltage of the battery that is based on profile data of the battery; and set the subsequent boundary condition based on the determined target change direction.

In another general aspect, a method with battery model optimization includes: setting a boundary condition for a target parameter of a battery model; determining an optimized parameter of the target parameter to be within the boundary condition; setting a subsequent boundary condition, with a range reduced from the current boundary condition, based on a difference between a state of the battery estimated using the battery model with the optimized parameter and a predetermined state of the battery; and optimizing the battery model by determining a subsequent optimized parameter of the target parameter to be within the subsequent boundary condition.

The set boundary condition may include a lower limit and an upper limit, and the determining of the optimized parameter may include determining the optimized parameter to be greater than or equal to the lower limit and less than or equal to the upper limit.

The setting of the subsequent boundary condition may include, based on whether the state of the battery estimated using the battery model is greater than the predetermined state of the battery, either one of: increasing at least one of the lower limit and the higher limit, and decreasing at least one of the lower limit and the higher limit.

Other features and aspects will be apparent from the following detailed description, the drawings, and the claims.

Figure 1:
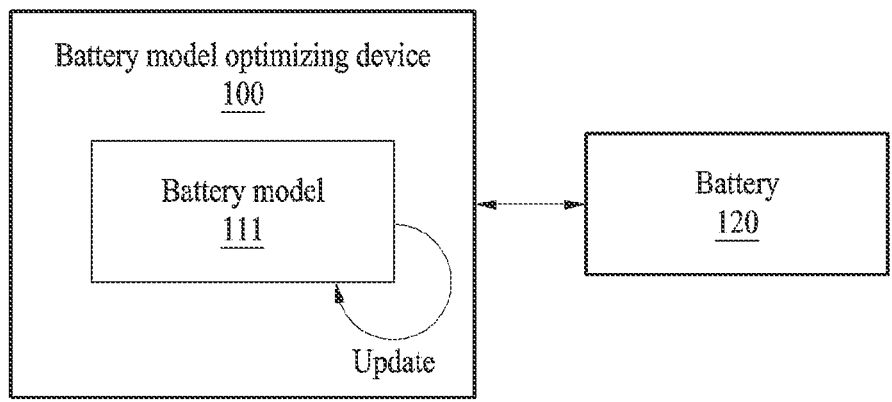
FIG. 1 illustrates an example of an overview of how a battery model optimizing device operates.

Throughout the drawings and the detailed description, unless otherwise described or provided, the same drawing reference numerals refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known, after an understanding of the disclosure of this application, may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

The terminology used herein is for the purpose of describing particular examples only, and is not to be used to limit the disclosure. As used herein, the singular forms "a," "an," and "the" are intended to include the plural forms as well, unless the context clearly indicates otherwise. As used herein, the term "and/or" includes any one and any combination of any two or more of the associated listed items. As used herein, the terms "include," "comprise," and "have" specify the presence of stated features, numbers, operations, elements, components, and/or combinations thereof, but do not preclude the presence or addition of one or more other features, numbers, operations, elements, components, and/or combinations thereof. The use of the term "may" herein with respect to an example or embodiment (for example, as to what an example or embodiment may include or implement) means that at least one example or embodiment exists where such a feature is included or implemented, while all examples are not limited thereto.

Although terms of "first" or "second" are used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween. Likewise, expressions, for example, "between" and "immediately between" and "adjacent to" and "immediately adjacent to" may also be construed as described in the foregoing.

Unless otherwise defined, all terms, including technical and scientific terms, used herein have the same meaning as commonly understood by one of ordinary skill in the art to which this disclosure pertains, consistent with and after an understanding of the present disclosure. Terms, such as those defined in commonly used dictionaries, are to be interpreted as having a meaning that is consistent with their meaning in the context of the relevant art and the present disclosure, and are not to be interpreted in an idealized or overly formal sense unless expressly so defined herein.

Also, in the description of example embodiments, detailed description of structures or functions that are thereby known after an understanding of the disclosure of the present application may be omitted when it is deemed that such description may cause ambiguous interpretation of the example embodiments. Hereinafter, examples will be described in detail with reference to the accompanying drawings, and like reference numerals in the drawings refer to like elements throughout.

FIG. 1 illustrates an example of an overview of how a battery model optimizing device operates.

Referring to FIG. 1, a battery model 111 may estimate a state (e.g., a state of charge (SOC), a voltage, etc.) of a battery 120 using various parameters and governing equations. The battery model 111 may be an electrochemical thermal (ECT) model based on battery physics information.

The parameters of the battery model 111 may represent, for example, a shape (e.g., thickness, radius, etc.), an open circuit potential (OCP), and physical properties (e.g., electrical conductivity, ionic conductivity, diffusion coefficient, etc.) of the battery 120. The governing equations may include an electrochemical reaction occurring on an interface between an electrode and an electrolyte and a physical conservation equation associated with the conservation of concentration and electrical charges of the electrode and the electrolyte, which are based on these parameters. The parameters of the battery model 111 may include a constant parameter independent of an SOC level of the battery 120 and a diffusion parameter dependent on the SOC level. For example, when the SOC level gradually decreases as the battery 120 operates, the constant parameter may remain constant and the diffusion parameter may change.

A battery model optimizing device 100, which is a device configured to perform optimization on the battery model 111, may search for optimized values of the parameters by updating several times the parameters used for the operation of the battery model 111. The battery model optimizing device 100 may automatically estimate the optimized values of the parameters of the battery model 111 through a multi-step optimization process to be described below. The battery model optimizing device 100 may reduce a calculation time and ensure the reliability of calculation results by changing a parameter to be optimized in each step and changing a boundary condition of each parameter. The battery model optimizing device 100 may derive the optimized values of the parameters used in the battery model 111 using a limited number of sets of data.

The battery model optimizing device 100 may perform optimization on the battery model 111 based on profile data for optimizing the battery model 111. The profile data may include experimental data on a state of the battery 120 measured in association with a current, a temperature, and a voltage. The profile data of various currents, temperatures, and voltages may be used for optimizing the battery model 111. The battery model optimizing device 100 may calculate an optimization loss based on a difference between an actual state value of the battery 120 corresponding to the profile data and an estimated value obtained using the battery model 111, and may update the parameters of the battery model 111 such that the optimization loss is reduced.

The battery model optimizing device 100 may be used to rapidly and accurately predict various parameters of a battery model applied to a power management integrated circuit (PMIC) or a power management system (BMS) that manages a battery of an electronic device (e.g., a smartphone, a tablet personal computer (PC), a robot cleaner, a cordless cleaner, a drone, a walking assistance device, an electric car, etc.) in which a secondary battery (e.g., a lithium-ion battery) is provided. The PMIC may estimate a state of a battery based on a voltage, current, and temperature of the battery, and use an electrochemical model (e.g., an ECT model) as a battery model to estimate the state of the battery. The electrochemical model may include a great number of parameters and require optimization of each of the parameters.

When performing optimization on the parameters, the battery model optimization device 100 may perform the optimization by dividing steps by parameter characteristics of the battery model 111 and reconstructing a boundary condition for a current optimization process based on a result of a previous optimization process. Additionally, the battery model optimizing device 100 may perform the optimization sequentially for SOC intervals by dividing the SOC intervals corresponding to degrees of progress in charging or discharging the battery 120. An optimization process for a battery model will be described below in greater detail. The optimization process for a battery model described herein may be applied to various types of batteries. The optimization process for a battery model may optimize the battery model within a short period of time without an expert, and produce a highly accurate optimization result.

Figure 2:
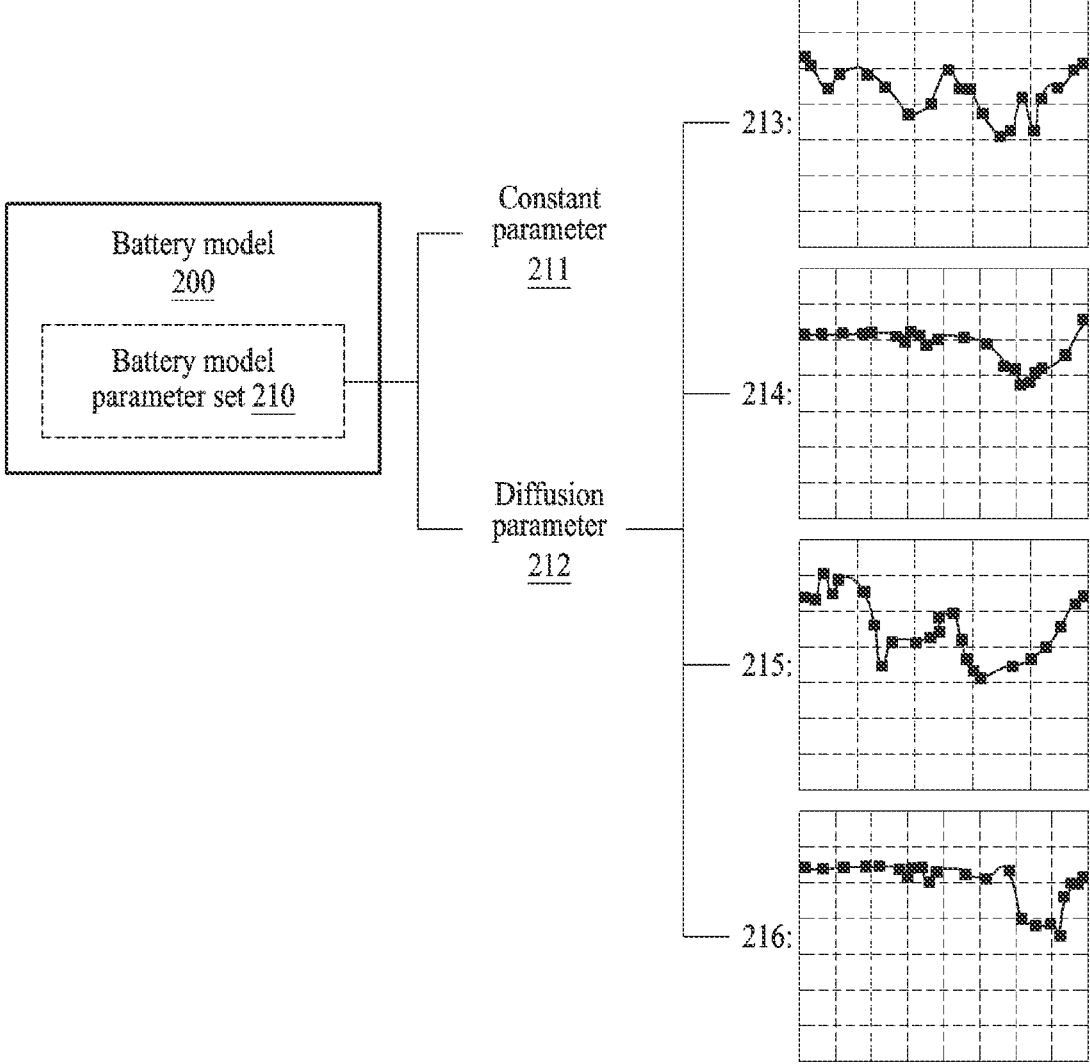
FIG. 2 illustrates an example of classifying parameters of a battery model.

FIG. 2 illustrates an example of classifying parameters of a battery model.

Referring to FIG. 2, a battery model 200 may include a battery model parameter set 210. Each of parameters in the battery model parameter set 210 may be classified into a constant parameter 211 and a diffusion parameter 212. The constant parameter 211 may include, for example, a cell shape (e.g., thickness, radius, etc.), a resistance, an OCR and the like that are independent of an SOC level of a battery. The diffusion parameter 212 may include diffusion parameters (or diffusion coefficients) dependent on the SOC level. The diffusion parameter 212 may include, for example, a charge parameter associated with charging of the battery and a discharge parameter associated with discharging of the battery.

As illustrated, parameters 213 may represent an anode discharge parameter, and parameters 214 may represent a cathode discharge parameter. In addition, parameters 215 may represent an anode charge parameter, and parameters 216 may represent a cathode charge parameter. The parameters 213 through 216 are indicated as points on respective graphs in FIG. 2. In the graphs of parameters 213 through 216, a horizontal axis represents an SOC level, and a vertical axis represents the magnitude of a diffusion coefficient. The diffusion parameter 212 may be defined or determined at required intervals. For example, although the parameters 213 are indicated in FIG. 2 as approximately 20 points with respect to 0.0 to 1.0 SOC levels, the parameters 213 may be present in a greater number at more dense intervals, or in a smaller number at more sparse intervals.

Figure 3:
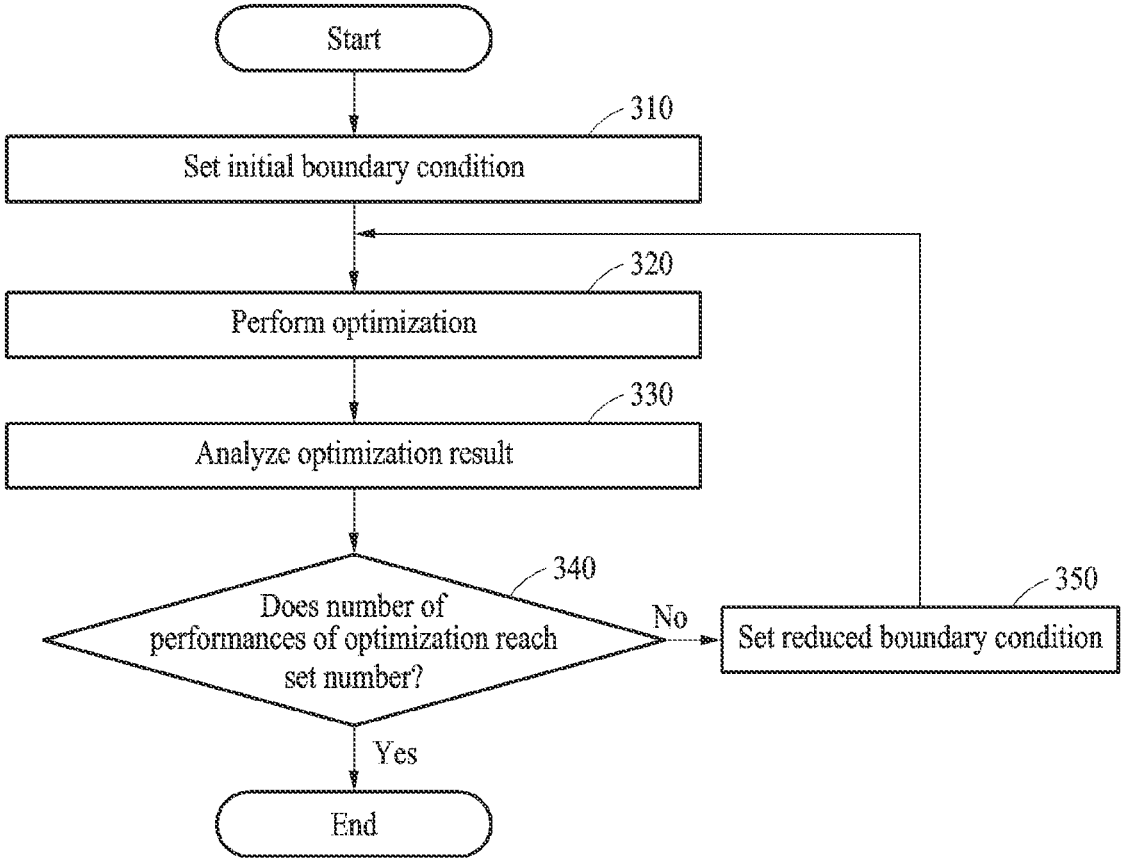
FIGS. 3 and 4 illustrate examples of a battery model optimizing method.
Figure 4:
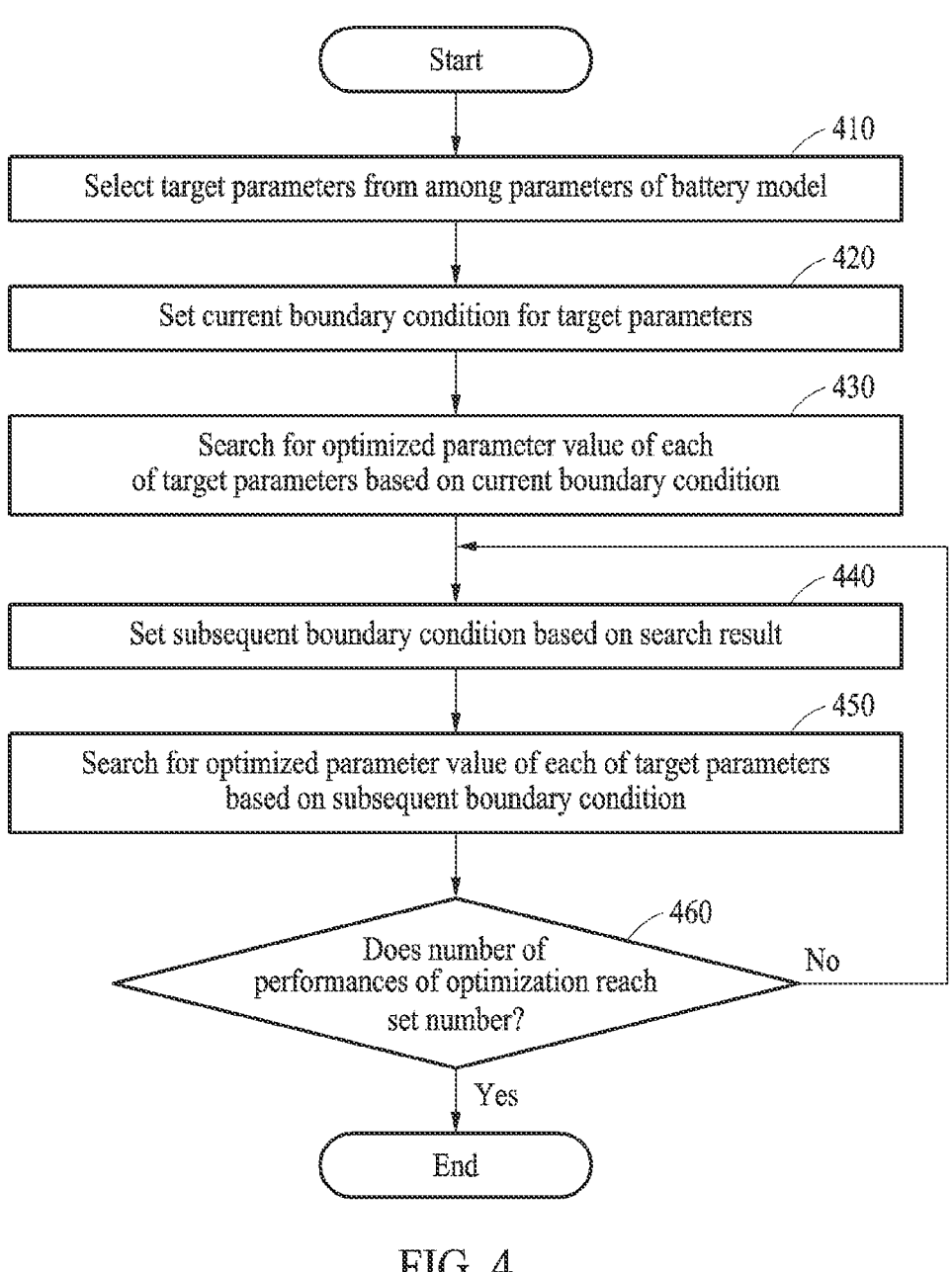

FIGS. 3 and 4 illustrate examples of a battery model optimizing method. The batty model optimizing method to be described hereinafter with reference to FIGS. 3 and 4 may be performed by a battery model optimizing device (e.g., the battery model optimizing device 100 of FIG. 1, a battery model optimizing device 1100 of FIG. 11, a battery model optimizing device 1211 of FIG. 12, and/or a battery model optimizing device 1320 of FIG. 13).

Referring to FIG. 3, in operation 310, the battery model optimization device may set an initial boundary condition for parameters of a battery model. The initial boundary condition may correspond to a predetermined boundary condition and may be determined, for example, through experimentation or expert tuning. A boundary condition described herein may define a lower limit and an upper limit of values of parameters when determining the values. In an optimization process, a value of a parameter may be determined to be a value between the lower limit and upper limit defined by the boundary condition (e.g., a value greater than or equal to the lower limit and less than or equal to the upper limit).

In operation 320, the battery model optimizing device may perform the optimization process on the battery model based on a current boundary condition. The initial boundary condition set in operation 310 may be initially used. The battery model optimizing device may obtain an estimated value of a state of a battery using the battery model for each parameter, and calculate an optimization loss based on a difference between the obtained estimated value and an actual state value that is based on profile data of the battery. The battery model optimizing device may update the parameter values to reduce the optimization loss. The optimization process may be performed separately on parameters that affect both charging and discharging of the battery and on parameters that affect each of the charging and discharging, based on parameter characteristics.

Hereinafter, the optimization process will be described in conjunction with an example of estimating a voltage of a battery through a battery model based on a current and temperature of the battery. When the battery model estimates a voltage of the battery based on a current and temperature of the battery, a result of estimating a state of the battery through the battery model, for a parameter $\theta$ with respect to a given current I and temperature T, may be represented as ECT $(I, T; \theta)$, and a value of ECT $(I, T; \theta)$ may correspond to a voltage value of the battery tracked by the battery model. The battery model optimizing device may calculate an error between ECT $(I, T; \theta)$ which is an estimated state of the battery and an actual state of the battery (e.g., a predetermined state of the battery based on the profile data). The error may respond to an optimization loss. The error may include a squared sum of error (SSE) between ECT $(I, T; \theta)$ and the actual state of the battery. According to examples, the error may be calculated using various calculation methods using, for example, a root-mean-square error (RMSE) or a maximum absolute error (MAE).

The battery model optimizing device may estimate a state of the battery using the battery model for any parameter, more than once. By estimating the state more than once, the battery model optimizing device may generate a parameter set which is a set of parameters used in the battery model. The parameter set may include a parameter applied to the battery model and an error between a state of the battery estimated using the parameter and an actual state of the battery. For example, when a state of the battery is estimated using the battery model n times, the parameter set may be represented as $S=\{(\theta1, E1), (\theta2, E2), \ldots, (\theta n, En)\}$. In this example, $\theta$ denotes a parameter applied to the battery model, and E denotes an error associated with the parameter.

The battery model optimizing device may use an optimization algorithm to determine a candidate parameter $\theta n+1$ which is most likely to improve (e.g., reduce) the error between the state of the battery obtained from the battery model and the actual state of the battery. The optimization algorithm may include, for example, a Bayesian optimization algorithm. The Bayesian optimization algorithm may search for, or determine, a global optimum using minimal evaluation. The Bayesian optimization algorithm may calculate a parameter combination that may minimize a loss function based on a probability, and search for an optimal combination by iteratively applying the calculation. Optimization may be performed based on a probability, and thus may be less likely to be constrained to a local optimum.

The battery model optimizing device may search for the candidate parameter $\theta n+1$ based on the current boundary condition to determine the candidate parameter $\theta n+1$. The battery model optimizing device may select a candidate parameter by performing gradient-based optimization an acquisition function. The battery model optimizing device may estimate a state of the battery using the battery model to which the selected candidate parameter is applied. For example, the battery model optimizing device may estimate a state ECT $(I, T; \theta n+1)$ of the battery using the candidate parameter $\theta n+1$. Subsequently, the battery model optimizing device may calculate an error (e.g., SSE) between ECT $(I, T;$ θn+1) and the actual state of the battery. The battery model optimizing device may update the parameters to reduce the error.

In operation 330, the battery model optimizing device may store and analyze a result of the optimization process performed in operation 320. In operation 340, the battery model optimizing device may determine whether the number of performances of the optimization process (e.g., the number of performances of operation 320) reaches a set number of performances. When the number of performances of the optimization process reaches the set number, the optimization process for the battery model may be terminated. In operation 350, when the number of performances of the optimization process does not reach the set number, the battery model optimizing device may set a reduced boundary condition that is reduced from a previous boundary condition used in the optimization process performed previously. The battery model optimizing device may set the reduced boundary condition based on a result of the previously performed optimization process. The reduced boundary condition may be a boundary condition having an interval that is reduced from an interval defined by an upper limit and a lower limit of the previous boundary condition. Subsequently, the battery model optimizing device may perform the optimization process again based on the reduced boundary condition. The battery model optimizing device may add the candidate parameter θn+1 to the parameter set and select a new candidate parameter. The battery model optimizing device may calculate an error between a state of the battery obtained from the battery model and the actual state of the battery, and iterate an operation of updating the parameter set to minimize the error. As such, when the optimization process in one step is terminated, the battery model optimizing device may perform the optimization process again by resetting a boundary condition for a subsequent step based on a result of the optimization process in the step.

The battery model optimizing device may perform operations 350, 320, and 330 iteratively until the number of performances of the optimization process reaches the set number.

FIG. 4 illustrates a detailed example of an optimization process.

Referring to FIG. 4, in operation 410, the battery model optimizing device may select target parameters from among parameters of a battery model. The battery model optimizing device may select specific points (or anchor points) associated with a diffusion characteristic of a battery from among the parameters of the battery model, and determine the target parameters based on the selected points. The target parameters may correspond to some of the parameters selected from all the parameters of the battery model. The target parameters may be determined such that a parameter dimension of the battery model is reduced while the physical diffusion characteristic of the battery model is maintained. For example, the battery model optimizing device may select the target parameters based on a value obtained by performing differentiation at least once on the parameters of the battery model. The battery model optimizing device may determine a target parameter based on a specific point at which the value obtained by performing the differentiation at least once is zero (or at which a derivative becomes zero). The battery model optimizing device may determine, to be a target parameter, a parameter by which a diffusion coefficient significantly changes at a corresponding specific point. The optimization process may be performed based on the target parameters, and the parameter dimension may be reduced by the target parameters. Thus, the battery model optimizing device of one or more embodiments may reduce a calculation amount and time used for the optimization process.

The battery model optimizing device may perform the optimization process on the target parameters by performing operations 420 through 460. In operation 420, the battery model optimizing device may set a current boundary condition for each of the target parameters. A preset initial boundary condition may be initially used as the current boundary condition. In operation 430, the battery model optimizing device may search for (e.g., determine) an optimized parameter value of each of the target parameters based on the set current boundary condition. The battery model optimizing device may determine an estimated state value of the battery model (or an estimated value of a state of the battery) based on the target parameters, and determine an optimization loss based on a difference between the estimated state value and an actual state value obtained from profile data of the battery. The battery model optimizing device may adjust at least one of the target parameters to reduce the optimization loss. For the searching for the optimized parameter value, the optimization process described above in association with operation 320 of FIG. 3 may be applied.

In an example, when performing the optimization process, the battery model optimizing device may perform the optimization process for each of predefined different SOC intervals corresponding to degrees of progress in charging or discharging the battery. For example, the battery model optimizing device may divide the SOC intervals into, for example, a 0-30% interval, a 30-70% interval, and a 70-100% interval, and optimize, sequentially for the SOC intervals, a diffusion characteristic of the battery model based on charging or discharging behavior. This optimization process of one or more embodiments may be performed even for an SOC interval for which optimization is not sufficiently performed due to a relatively low importance compared to other SOC intervals, and may thus improve an optimization sensitivity of this SOC interval.

In another example, when performing the optimization process, the battery model optimizing device may perform the optimization process for each of temperature intervals. For example, the battery model optimizing device may set predefined temperature intervals respectively corresponding to a low temperature, a room temperature, and a high temperature, and perform the optimization process for each of the temperature intervals. The battery model optimizing device may calculate an estimated state value of the battery model for each temperature interval, and determine an optimization loss based on the calculated estimated state value and profile data of each temperature interval. The battery model optimizing device may adjust the parameters to reduce the optimization loss.

In operation 440, the battery model optimizing device may set a subsequent boundary condition that is reduced from the current boundary condition based on a previous search result for the optimized parameter value. The battery model optimizing device may change a boundary condition for all the target parameters based on the optimized parameter value retrieved based on the current boundary condition.

In an example of operation 440, the battery model optimizing device may calculate a voltage error between a voltage of the battery that is estimated through the battery model in a previous optimization process and a voltage of the battery that is based on profile data of the battery, and determine a target change direction of a diffusion parameter (or the diffusion coefficient) based on the calculated voltage error. The battery model optimizing device may set the subsequent boundary condition based on the determined target change direction. In a case of the diffusion parameter, a direction to be changed may be known or determined based on the voltage error, and a boundary condition to be used in a subsequent optimization process to be performed subsequently may be set based on the direction.

In operation 450, the battery model optimizing device may search for an optimized parameter value for each of the target parameters based on the set subsequent boundary condition. Operation 450 may be the same as operation 430 except that the boundary condition is changed, and thus a repeated description thereof will be omitted here.

In operation 460, the battery model optimizing device may determine whether the number of performances of the optimization process reaches a set number of performances. When the number of performances of the optimization process reaches the set number, the optimization process for the battery model may be terminated. When the number of performances of the optimization process does not reach the set number, the battery model optimizing device may set the subsequent boundary condition based on a previous search result and perform again the optimization process in operation 450. The battery model optimizing device may iteratively perform the operation of setting a subsequent boundary condition reduced from a current boundary condition and the operation of searching for an optimized parameter value of each of the target parameters based on the subsequent boundary condition, until the number of performances of the optimization process reaches the set number.

When moving to a next step of the optimization process, the battery model optimizing device may perform optimization while changing the boundary condition based on an optimization result from a previous step, as described above. The battery model optimizing device of one or more embodiments may improve optimization efficiency by varying the boundary condition based on the optimization result from the previous step based on parameter characteristics. The optimization process of one or more embodiments described above may enable the generation of a battery model that provides stable performance to different types of batteries and in various battery operating situations (e.g., temperature, operating condition, etc.).

Figure 5:
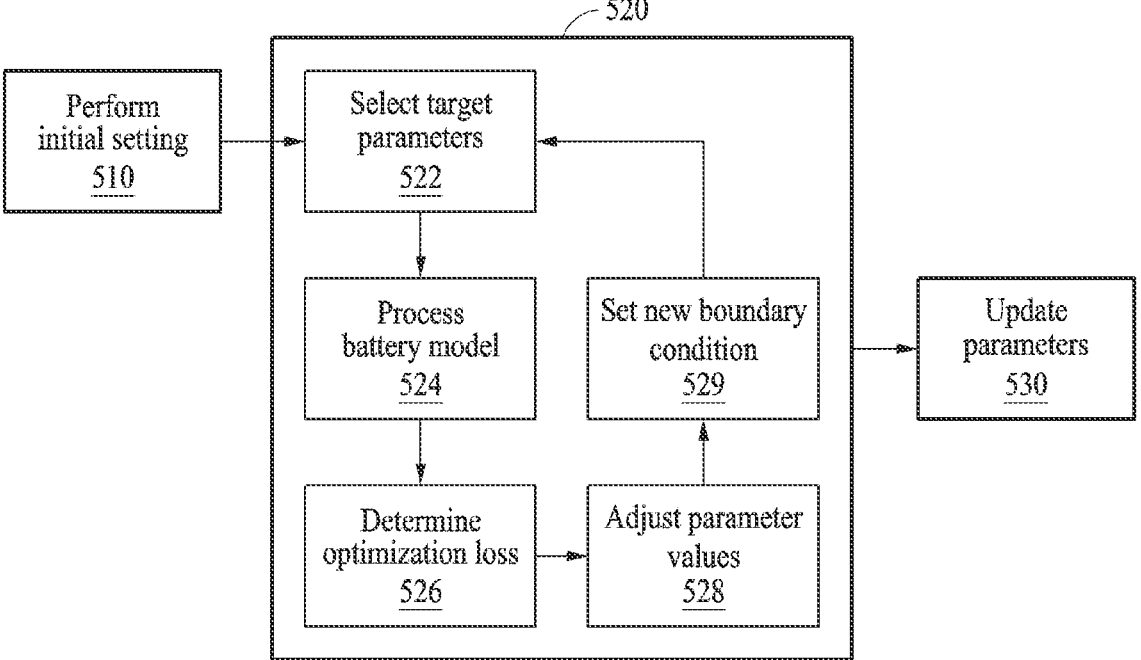
FIG. 5 illustrates an example of optimizing parameters of a battery model.

FIG. 5 illustrates an example of optimizing parameters of a battery model.

Referring to FIG. 5, in operation 510, a battery model optimizing device may perform an initial setting. The battery model optimizing device may identify various parameters of a battery model during the initial setting and set an initial boundary condition for optimization. The initial boundary condition may be defined in advance or experimentally determined. In operation 520, the battery model optimizing device may perform an optimization process on the parameters of the battery model.

In operation 522, the battery model optimizing device may select target parameters from among the parameters of the battery model. The battery model optimizing device may thereby reduce the number of parameters to be used for optimization. For example, the battery model optimizing device may perform optimization by extracting specific points from where a derivative is zero in a diffusion coefficient.

In operation 524, the battery model optimizing device may obtain an estimated state value (e.g., an SOC and a voltage) of a battery by processing the battery model. For example, the battery model optimizing device may obtain an estimated value of a voltage of the battery based on an operation (or computation) of the battery model that is based on a current and temperature of the battery and a parameter set of the battery model.

In operation 526, the battery model optimizing device may determine an optimization loss. The battery model optimizing device may determine the optimization loss based on a difference between predefined profile data of the battery and a state value of the battery estimated using the battery model. The profile data may include an actually measured state value or a reference value of the battery. The battery model optimizing device may determine the optimization loss based on a probability of a Bayesian optimization algorithm.

In operation 528, the battery model optimizing device may adjust a parameter value based on the optimization loss. The battery model optimizing device may adjust the parameter value to determine a new parameter. The battery model optimizing device may adjust the parameter value such that the optimization loss is reduced, for example, minimized.

In operation 529, the battery model optimizing device may set a new boundary condition having a reduced range compared to a previous boundary condition, based on a result of operation 528. For example, the battery model optimizing device may set a boundary condition having a range with a smaller magnitude than a reference of a magnitude of the parameter value determined in operation 528. Subsequently, the battery model optimizing device may iteratively perform several times operation 522 of selecting target parameters, operation 524 of processing the battery model, operation 526 of determining an optimization loss, operation 528 of adjusting a parameter value, and operation 529 of setting a new boundary condition. This optimization process may be iteratively performed until a preset number of iterations is reached or until the optimization loss satisfies a defined condition. In addition, the battery model optimizing device may perform the optimization process for each SOC interval or temperature interval according to examples, to which what has been described above with reference to FIG. 4 may be applied.

In operation 530, when the optimization process of operation 520 is terminated, the battery model optimizing device may update the parameters of the battery model based on the optimized parameter values derived by the iteration of the optimization process. The battery model with the updated parameters may be used to estimate a state of the battery.

For optimization of a battery model, iterative performances of the optimization process may be used. When a typical battery model optimizing device uses a fixed boundary condition, a great amount of iterative calculations may be performed to minimize an optimization loss (or a cost function). As the number of iterative calculations increases, a calculation amount and time may increase accordingly. However, as described above, the battery model optimizing device of one or more embodiments may perform optimization based on some target parameters and gradually reduce a boundary condition as the optimization process progresses, thereby reducing the number of iterations and the calculation time for optimization.

Figure 6:
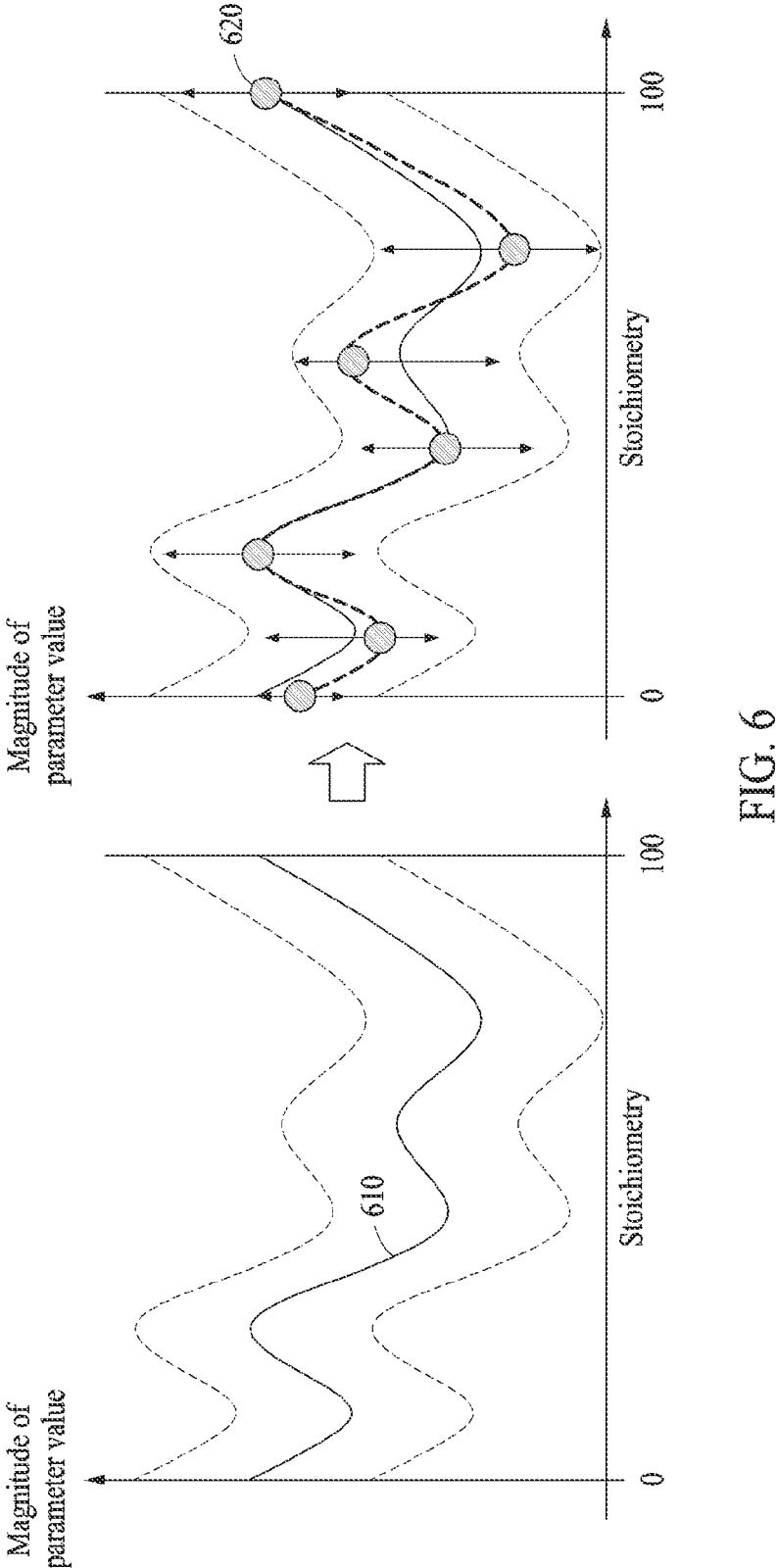
FIG. 6 illustrates an example of selecting a target parameter.

FIG. 6 illustrates an example of selecting a target parameter.

Referring to FIG. 6, illustrated are a parameter 610 based on stoichiometry included in a battery model, and a target parameter 620 selected when a parameter dimension is reduced by a battery model optimizing device. The battery model optimizing device may extract a specific point from an initial value of the parameter 610 and select the extracted specific point as the target parameter 620. For example, the battery model optimizing device may select, as the target parameter 620, a specific point at which a value obtained by performing differentiation at least once on the parameter 610 is zero. In the example of FIG. 6, values of the target parameter 620 may correspond to specific points of a point at which a first derivative is zero. However, specific points of a point at which a derivative of a higher order, for example, a second or higher derivative, is zero may also be selected as target parameters. The battery model optimizing device may perform optimization only on the target parameter 620 having a reduced dimension. The battery model optimizing device may determine a parameter value of another point, excluding the target parameter 620, by performing interpolation based on optimized values of the target parameter 620 corresponding to the specific points. For example, the battery model optimizing device may perform the interpolation using a Gaussian process regression (GPR) method as a non-parametric model. In the example of FIG. 6, the battery model optimizing device may extract the value of the target parameter 620 corresponding to seven specific points, perform optimization only on the extracted values of the target parameter 620, and then determine another parameter value excluding the target parameter 620 through the interpolation. The battery model optimizing device may set a boundary condition for searching for an optimized parameter value based on the initial value of the parameter 610. In the illustrated graphs of FIG. 6, boundaries indicated in dotted lines may correspond to the boundary condition.

Figure 7:
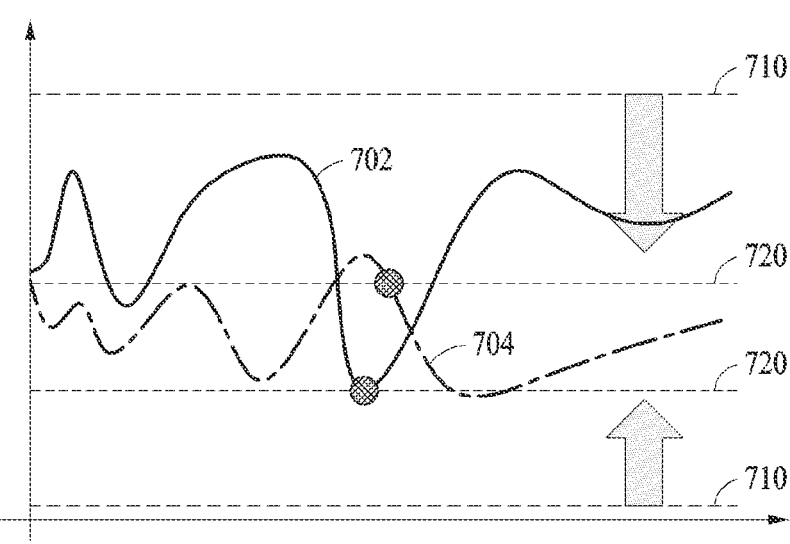
FIG. 7 illustrates an example of a reduced boundary condition.

FIG. 7 illustrates an example of a reduced boundary condition.

Referring to FIG. 7, a reduced boundary condition may be applied to a parameter 702 and/or a parameter 704 of a battery model that represents a diffusion characteristic. In the illustrated graph, a vertical axis indicates a magnitude of a parameter value, and a horizontal axis indicates an SOC level. When a previous boundary condition 710 is determined for the parameter 702 and then a boundary condition for a subsequent optimization process is determined to be a boundary condition 720 from the boundary condition 710, the subsequent optimization process may be performed based on the boundary condition 720. An optimized parameter value of the parameter 702 may be determined to be a value between intervals corresponding to the boundary condition 720 by being constrained to the boundary condition 720.

Figure 8:
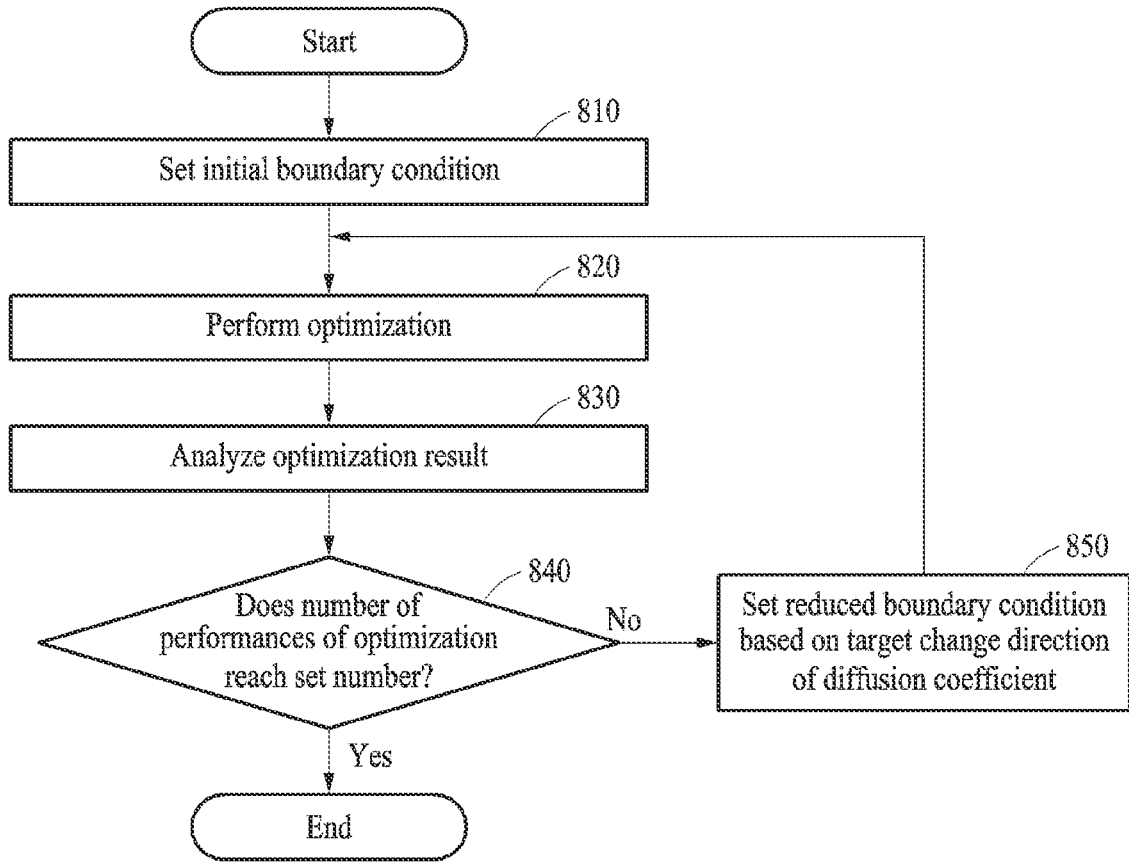
FIG. 8 illustrates an example of optimizing parameters of a battery model based on a target change direction of a diffusion coefficient.

FIG. 8 illustrates an example of optimizing parameters of a battery model based on a target change direction of a diffusion coefficient.

Referring to FIG. 8, operations 810, 820, 830, and 840 may respectively correspond to operations 310, 320, 330, and 340 described above with reference to FIG. 3, and thus a repeated description thereof will be omitted here. In operation 850, for a diffusion coefficient corresponding to a diffusion parameter, a battery model optimizing device may set a boundary condition that is reduced from a previous one based on a target change direction of the diffusion coefficient. Here, the target change direction may indicate a direction in which the diffusion coefficient is to be changed desirably. The battery model optimizing device may calculate a voltage error between a voltage of a battery estimated through a battery model in a previous optimization process and a voltage of the battery that is based on profile data of the battery, and determine the target change direction based on the calculated voltage error. The battery model optimizing device may set a subsequent boundary condition based on a boundary condition for the diffusion coefficient having a directivity of the target change direction. The battery model optimizing device may iteratively perform the optimization process based on the set subsequent boundary condition. This optimization process may be performed until the number of performances of the optimization process reaches a set number of performances.

Figure 9:
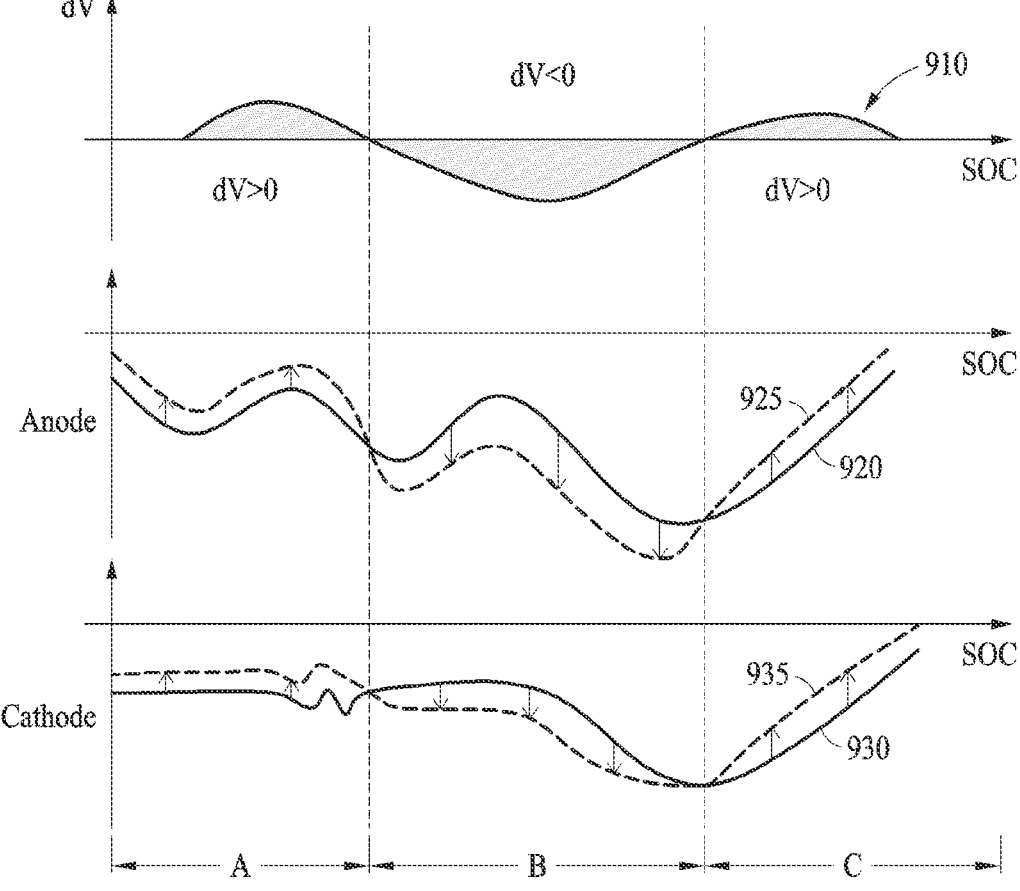
FIG. 9 illustrates an example of setting a boundary condition based on a target change direction of a diffusion coefficient.

FIG. 9 illustrates an example of setting a boundary condition based on a target change direction of a diffusion coefficient.

Referring to FIG. 9, when a voltage error between a voltage of a battery estimated through a battery model and a voltage of the battery based on profile data of the battery is not zero, a direction in which a diffusion coefficient is to move to have a desirable value may be determined. A new boundary condition to be applied to the diffusion coefficient may be set based on the voltage error for each SOC level. The direction in which the diffusion coefficient is to physically change may be set based on a sign of the voltage error. A change 910 in a value of the voltage error in intervals A, B, and C based on a change in the voltage error is illustrated.

For example, when the voltage error (or difference, for example) is a positive value in an SOC of a battery, the voltage error may be reduced by moving upward a boundary condition 920 for an anode diffusion coefficient and a boundary condition 930 for a cathode diffusion coefficient. In contrast, when the voltage error is a negative value, the voltage error may be reduced by moving downward the boundary condition 920 for the anode diffusion coefficient and the boundary condition 930 for the cathode diffusion coefficient. A new boundary condition 925 for the anode diffusion coefficient and a new boundary condition 935 for the cathode diffusion coefficient that are based on the sign of the voltage error are also illustrated. Setting a boundary condition for a diffusion coefficient used for optimization based on physical meanings of battery characteristics may improve the efficiency of an optimization process and improve the accuracy of a battery model.

Figure 10:
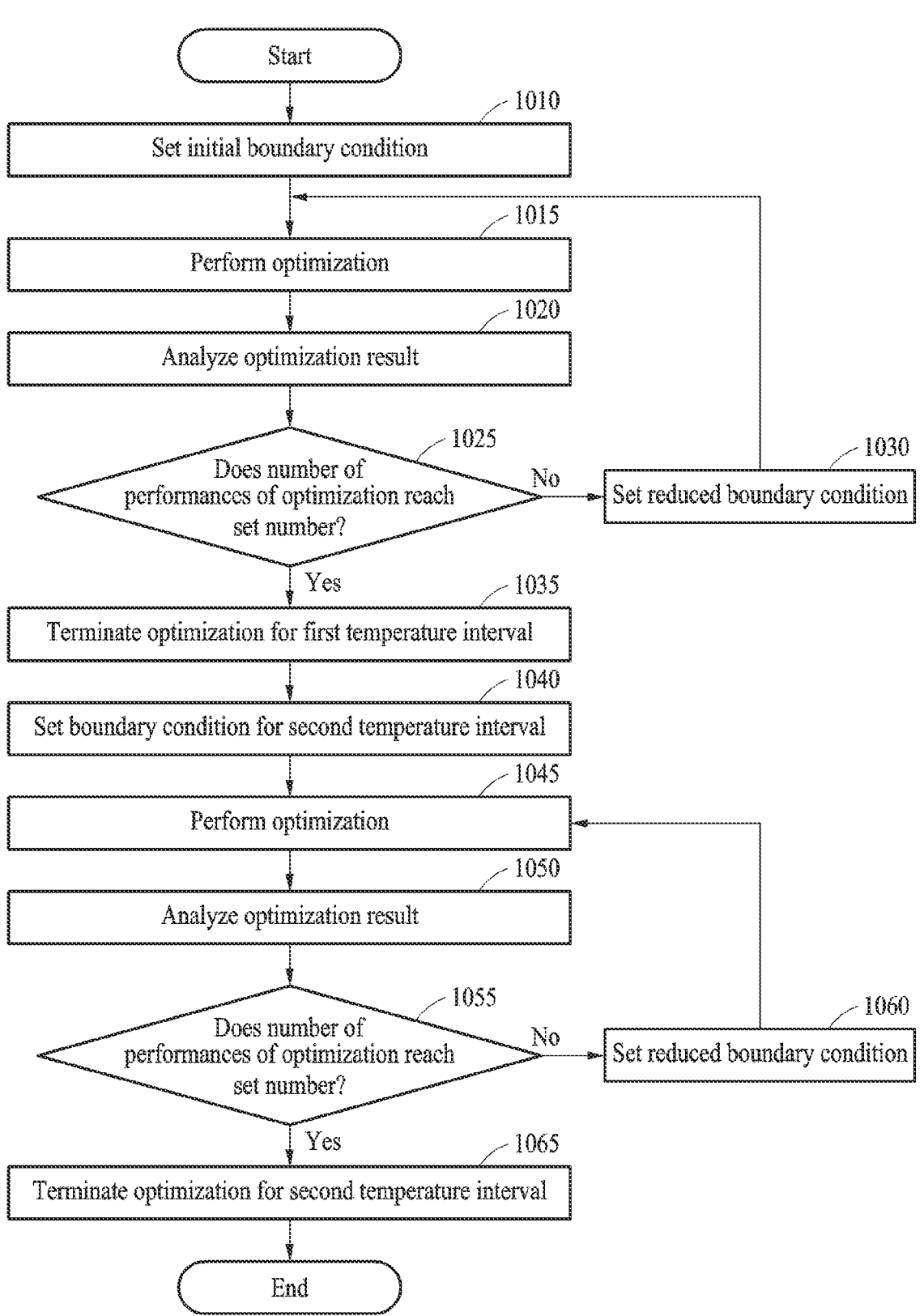
FIG. 10 illustrates an example of optimizing parameters of a battery model for each temperature interval.

FIG. 10 illustrates an example of optimizing parameters of a battery model for each temperature interval.

A battery model optimizing device may perform an optimization process on parameters of a battery model for each of predefined temperature intervals. Referring to FIG. 10, an optimization process including operations 1010, 1015, 1020, 1025, and 1030 may be performed for a first temperature interval. When the number of performances of the optimization process for the first temperature interval reaches a set number of performances in operation 1025, the optimization process for the first temperature interval may be terminated in operation 1035. Subsequently, in operation 1040, a boundary condition for a second temperature interval may be set, and an optimization process including operations 1040, 1045, 1050, 1055, and 1060 may be performed for the second temperature interval. When the number of performances of the optimization process for the second temperature interval reaches a set number of performances in operation 1055, the optimization process for the second temperature interval may be terminated in operation 1065. In the optimization process for each temperature interval, optimization may be performed according to a characteristic of each temperature interval, and profile data or parameters corresponding to each temperature interval may be used. The optimization process described above with reference to FIGS. 3 and 4 may apply to the optimization process described with reference to FIG. 10.

Although the optimization process is described above as being performed separately for the first temperature interval and the second temperature interval, a temperature interval may be divided into three or more temperature intervals and optimization may be performed for each of the temperature intervals. For example, the temperature intervals may be defined as a first temperature interval corresponding to a low temperature, a second temperature interval corresponding to a room temperature, and a third temperature interval corresponding to a high temperature. In this example, the optimization process described above may be performed for each of the first, second, and third temperature intervals. As described above, performing optimization for each temperature interval may enable effective optimization of a parameter specified to each temperature interval, and also enable effective optimization of a battery model having different parameter sets corresponding to temperature intervals.

Figure 11:
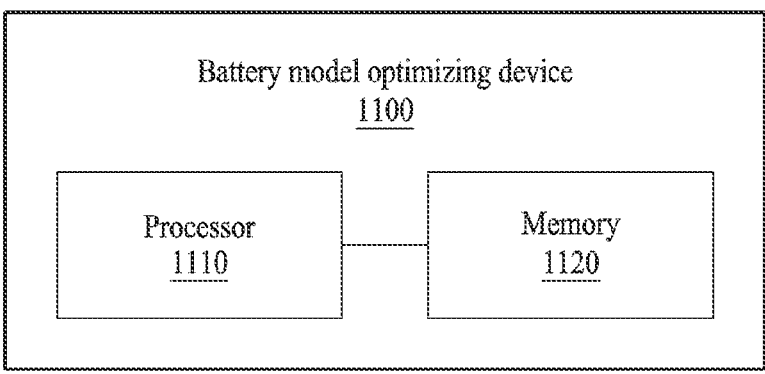
FIG. 11 illustrates an example of a battery model optimizing device.

FIG. 11 illustrates an example of a battery model optimizing device.

Referring to FIG. 11, a battery model optimizing device 1100 may include a processor 1110 (e.g., one or more processors) and a memory 1120 (e.g., one or more memories). The memory 1120 may be connected to the processor 1110, and store instructions executable by the processor 1110, data to be processed by the processor 1110, or data processed by the processor 1110. The memory 1120 may include a non-transitory computer-readable medium, for example, a high-speed random-access memory (RAM), and/or a nonvolatile computer-readable storage medium (e.g., one or more disk storage devices, flash memory devices, or other nonvolatile solid state memory devices).

The processor 1110 may control an overall operation of the battery model optimizing device 1100 and execute functions and instructions for performing the operation in the battery model optimizing device 1100. The processor 1110 may execute instructions for performing one or more, or all, of the operations described above with reference to FIGS. 1 through 10. When the instructions are executed in the processor 1110, the processor 1110 may perform an optimization process for determining optimized parameter values of parameters of a battery model. In the optimization process, the processor 1110 may select target parameters from among the parameters of the battery model. The processor 1110 may select specific points associated with a diffusion characteristic of a battery from among the parameters of the battery model and determine the target parameters based on the selected points. For example, the processor 1110 may select the target parameters based on a value obtained by performing differentiation at least once on the parameters of the battery model. The processor 1110 may set a current boundary condition for each of the target parameters and search for an optimized parameter value of each of the target parameters based on the set current boundary condition. The processor 1110 may determine an estimated state value of the battery model based on the target parameters, and determine an optimization loss based on a difference between the estimated state value and an actual state value obtained from profile data of the battery. The processor 1110 may adjust at least one of the target parameters to reduce the optimization loss.

The processor 1110 may set a subsequent boundary condition reduced from the current boundary condition based on a result of searching for the optimized parameter values. The processor 1110 may change a boundary condition for all the target parameters based on the optimized parameter values retrieved based on the current boundary condition, and set the changed boundary condition to be the subsequent boundary condition. The processor 1110 may determine a target change direction of a diffusion parameter based on a voltage error between a voltage of the battery estimated through the battery model and a voltage of the battery that is based on profile data of the battery, and set the subsequent boundary condition based on the determined target change direction. The processor 1110 may perform again the operation of searching for an optimized parameter value of each of the target parameters based on the set subsequent boundary condition. The processor 1110 may iteratively perform the operation of setting a subsequent boundary condition reduced from a current boundary condition and the operation of searching for an optimized parameter value of each of the target parameters based on the subsequent boundary condition, until the number of performances of the optimization process reaches a set number of performances.

In an example, the processor 1110 may perform the optimization process described above for each of predefined different SOC intervals corresponding to degrees of progress in charging the battery. In addition, the processor 1110 may perform the optimization process based on predefined different SOC intervals corresponding to degrees of progress in discharging the battery. The processor 1110 may perform the optimization process based also on predefined temperature intervals in addition to the SOC intervals. The processor 1110 may also perform operations related to the optimization process described herein.

Figure 12:
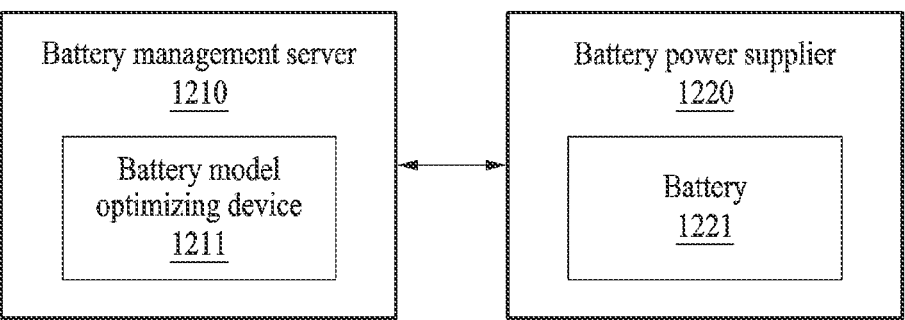
FIG. 12 illustrates an example of a battery management server including a battery model optimizing device.

FIG. 12 illustrates an example of a battery management server including a battery model optimizing device.

Referring to FIG. 12, a battery model optimizing device 1211 may be included in a battery management server 1210. The battery model optimizing device 1211 may correspond to the battery model optimizing device described herein, for example, the battery model optimizing device 100 of FIG. 1 and the battery model optimizing device 1100 of FIG. 11. The battery model optimizing device 1211 may receive operation data of a battery 1221 from a battery power supplier 1220 and store the received operation data. When optimization of a battery model corresponding to the battery 1221 is to be performed, the battery model optimizing device 1211 may optimize parameters of the battery model based on the operation data, and provide updated parameters obtained as a result of the performed optimization to the battery power supplier 1220. The battery model optimizing device 1211 may optimize the parameters based on the optimization process described herein. The battery power supplier 1220 may provide an external device with power supplied from the battery 1221, and estimate an SOC of the battery 1221 using the battery model based on the parameters optimized by the battery model optimizing device 1211.

Figure 13:
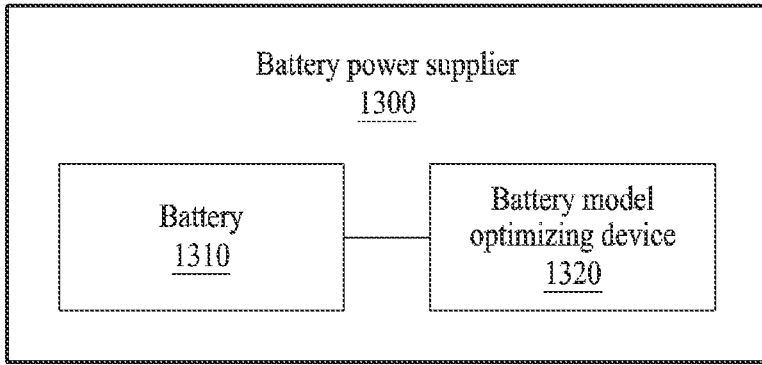
FIG. 13 illustrates an example of a battery power supplier including a battery model optimizing device.

FIG. 13 illustrates an example of a battery power supplier including a battery model optimizing device.

Referring to FIG. 13, a battery power supplier 1300 may include a battery 1310 and a battery model optimizing device 1320. The battery model optimizing device 1320 may correspond to the battery model optimizing device described herein, for example, the battery model optimizing device 100 of FIG. 1 and the battery model optimizing device 1100 of FIG. 11. The battery power supplier 1300 may provide an external device with power supplied from the battery 1310 and be implemented as a part of a BMS. The battery 1310 may supply power to an electronic device connected to the battery power supplier 1300, and the battery model optimizing device 1320 may optimize a battery model corresponding to the battery 1310.

When optimizing the battery model, the battery model optimizing device 1320 may perform an operation of selecting target parameters from among parameters of the battery model, an operation of setting a current boundary condition for each of the target parameters, an operation of searching for an optimized parameter value of each of the target parameters based on the set current boundary condition, an operation of setting a subsequent boundary condition reduced from the current boundary condition based on a result of the searching, and an operation of searching for an optimized parameter value of each of the target parameters based on the subsequent boundary condition. The battery model optimizing device 1320 may determine a target change direction of a diffusion parameter based on a voltage error between a voltage of the battery 1310 estimated through the battery model and a voltage that is based on profile data of the battery 1310, and set the subsequent boundary condition based on the determined target change direction. The battery model optimizing device 1320 may perform the optimization process for each of predefined different SOC intervals corresponding to degrees of progress in charging or discharging the battery 1310. In addition, the battery model optimizing device 1320 may perform the optimization process for each of predefined temperature intervals. Further, the battery model optimizing device 1320 may perform other operations described herein for the optimization process.

The battery model optimizing devices, batteries, processors, memories, battery management servers, battery power suppliers, battery model optimizing device 100, battery 120, battery model optimizing device 1100, processor 1110, memory 1120, battery management server 1210, battery model optimizing device 1211, battery power supplier 1220, battery 1221, battery power supplier 1300, battery 1310, battery model optimizing device 1320, and other devices, apparatuses, devices, units, modules, and components described herein with respect to FIGS. 1-13 are implemented by or representative of hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-13 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

What is claimed is:

1. A device with battery model optimization, the device comprising:
    a processor configured to:
    perform optimization on a battery model, for determining optimized parameter values of parameters of the battery model,
    wherein, to perform the optimization, the processor is configured to:
      select target parameters from among the parameters of the battery model;
      set a current boundary condition for each of the target parameters;
      determine an optimized parameter value of each of the target parameters based on the set current boundary condition;
      set a subsequent boundary condition reduced from the current boundary condition based on the determined optimized parameter value; and
      determine a subsequent optimized parameter value of each of the target parameters based on the subsequent boundary condition; and
    estimate a state of a battery using the battery model having the optimized parameter values of the parameters of the battery model,
    wherein, for the performing optimization, the processor is further configured to perform the optimization for each of state of charge (SOC) intervals by determining the SOC intervals as corresponding to respective degrees of progress in charging or discharging the battery, wherein the processor is configured to
    determine whether a number of performances of the optimization reaches a preset number of performances, and
    until the number of performances of the optimization reaches the preset number and until an optimization loss satisfies a defined condition, iteratively perform the setting of the subsequent boundary condition reduced from the current boundary condition and the determining of the subsequent optimized parameter value of each of the target parameters based on the subsequent boundary condition, and
    wherein, for the setting of the subsequent boundary condition, the processor is configured to:
    determine a target change direction of a diffusion parameter based on a voltage error between a voltage of the battery that is estimated through the battery model and a voltage of the battery that is based on profile data of the battery; and
    set the subsequent boundary condition based on the determined target change direction.

2. The device of claim 1, wherein the processor is configured to perform the optimization for each of pre-defined temperature intervals.

3. The device of claim 1, wherein the processor is configured to select the target parameters based on a value obtained by performing differentiation one or more times on the parameters of the battery model.

4. The device of claim 1, wherein
    for the setting of the subsequent boundary condition, the processor is configured to change the current boundary condition for all the target parameters based on the optimized parameter value retrieved based on the current boundary condition, and
    the changed boundary condition corresponds to the subsequent boundary condition.

5. The device of claim 1, wherein the processor is configured to:
    select points associated with a diffusion characteristic of the battery from among the parameters of the battery model; and
    for the selecting of the target parameters, determine the target parameters based on the selected points.

6. The device of claim 1, wherein the processor is configured to:
    determine an estimated state value of the battery model based on the target parameters;
    determine an optimization loss based on a difference between the estimated state value and an actual state value obtained from profile data of the battery; and
    adjust at least one of the target parameters such that the optimization loss is reduced.

7. The device of claim 1, wherein
    the parameters of the battery model comprise a diffusion parameter dependent on an SOC level of the battery, and
    the diffusion parameter comprises a charge parameter associated with charging of the battery and a discharge parameter associated with discharging of the battery.

8. A processor-implemented method with battery model optimization, the method comprising:
    selecting target parameters from among parameters of a battery model;
    performing optimization on the target parameters, wherein the performing of the optimization comprises:
      setting a current boundary condition for each of the target parameters;

determining an optimized parameter value of each of the target parameters based on the set current boundary condition;

setting a subsequent boundary condition reduced from the current boundary condition based on the determined optimized parameter value; and determining a subsequent optimized parameter value of each of the target parameters based on the subsequent boundary condition; and estimating a state of a battery using the battery model having the optimized parameter values of the parameters of the battery model, wherein the performing optimization further includes performing the optimization for each of state of charge (SOC) intervals by determining the SOC intervals as corresponding to respective degrees of progress in charging or discharging the battery, and wherein the performing optimization further includes determining whether a number of performances of the optimization reaches a preset number of performances, and until the number of performances of the optimization reaches the preset number and until an optimization loss satisfies a defined condition, iteratively performing the setting of the subsequent boundary condition reduced from the current boundary condition and the determining of the subsequent optimized parameter value of each of the target parameters based on the subsequent boundary condition, and wherein the setting of the subsequent boundary condition comprises:

determining a target change direction of a diffusion parameter based on a voltage error between a voltage of the battery that is estimated through the battery model and a voltage of the battery that is based on profile data of the battery; and setting the subsequent boundary condition based on the determined target change direction.

9. The method of claim 8, wherein the performing of the optimization comprises performing the optimization for each of predefined temperature intervals.

10. A non-transitory computer-readable storage medium storing instructions that, when executed by a processor, configure the processor to perform the method of claim 8.

11. A battery power supplier, comprising:

a battery configured to supply power to an electronic device;

a battery model optimizing device configured to optimize a battery model corresponding to the battery, wherein, for the optimizing of the battery model, the battery model optimizing device is configured to:

select target parameters from among parameters of the battery model;

set a current boundary condition for each of the target parameters;

determine an optimized parameter value of each of the target parameters based on the set current boundary condition;

set a subsequent boundary condition reduced from the current boundary condition based on the determined optimized parameter value; and determine a subsequent optimized parameter value of each of the target parameters based on the subsequent boundary condition; and a processor configured to estimate a state of a battery using the battery model having the optimized parameter values of the parameters of the battery model, wherein, for the performing optimization, the battery model optimizing device is further configured to perform the optimization for each of state of charge (SOC) intervals by determining the SOC intervals as corresponding to respective degrees of progress in charging or discharging the battery, and wherein the processor is configured to determine whether a number of performances of the optimization reaches a preset number of performances, and until the number of performances of the optimization reaches the preset number and until an optimization loss satisfies a defined condition, iteratively perform the setting of the subsequent boundary condition reduced from the current boundary condition and the determining of the subsequent optimized parameter value of each of the target parameters based on the subsequent boundary condition, and wherein, for the setting of the subsequent boundary condition, the battery model optimizing device is configured to:

determine a target change direction of a diffusion parameter based on a voltage error between a voltage of the battery that is estimated through the battery model and a voltage of the battery that is based on profile data of the battery; and set the subsequent boundary condition based on the determined target change direction.

12. A processor-implemented method with battery model optimization, the method comprising:

setting a current boundary condition for a target parameter of a battery model;

determining an optimized parameter of the target parameter to be within the boundary condition;

setting a subsequent boundary condition, with a range reduced from the current boundary condition, based on a difference between a state of the battery estimated using the battery model with the optimized parameter and a predetermined state of the battery;

optimizing the battery model by determining a subsequent optimized parameter of the target parameter to be within the subsequent boundary condition, further including optimizing the battery model for each of state of charge (SOC) intervals by determining the SOC intervals as corresponding to respective degrees of progress in charging or discharging the battery; and estimating a state of a battery using the battery model with optimized parameters of the battery model, wherein the optimizing of the battery model further includes determining whether a number of performances of the optimization reaches a preset count of performances, and until the number of performances of the optimization reaches the preset count and until an optimization loss satisfies a defined condition, iteratively performing the setting of the subsequent boundary condition reduced from the current boundary condition and the determining of the subsequent optimized parameter value of the target parameter based on the subsequent boundary condition, and wherein the setting of the subsequent boundary condition comprises:

determining a target change direction of a diffusion parameter based on a voltage error between a voltage of the battery that is estimated through the battery model and a voltage of the battery that is based on profile data of the battery; and setting the subsequent boundary condition based on the determined target change direction.

13. The method of claim 12, wherein the set current boundary condition comprises a lower limit and an upper limit, and the determining of the optimized parameter comprises determining the optimized parameter to be greater than or equal to the lower limit and less than or equal to the upper limit.

14. The method of claim 13, wherein the setting of the subsequent boundary condition comprises, based on whether the state of the battery estimated using the battery model is greater than the predetermined state of the battery, either one of:

increasing at least one of the lower limit and the higher limit, and decreasing at least one of the lower limit and the higher limit.

\* \* \* \* \*